(12) United States Patent
Ramachandran et al.

(10) Patent No.: US 7,202,187 B2
(45) Date of Patent: Apr. 10, 2007

(54) METHOD OF FORMING SIDEWALL SPACER USING DUAL-FREQUENCY PLASMA ENHANCED CVD

(75) Inventors: Ravikumar Ramachandran, Pleasantville, NY (US); James T. Kelliher, Wappingers Falls, NY (US); Shreesh Narasimha, Beacon, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 35 days.

(21) Appl. No.: 10/710,257

(22) Filed: Jun. 29, 2004

(65) Prior Publication Data

US 2005/0287823 A1    Dec. 29, 2005

(51) Int. Cl.
   *H01L 21/469* (2006.01)
   *H01L 21/31* (2006.01)
(52) U.S. Cl. .................... 438/791; 438/792
(58) Field of Classification Search ........... 438/303, 438/680, 791, 792
   See application file for complete search history.

(56) References Cited

U.S. PATENT DOCUMENTS

| | | | |
|---|---|---|---|
| 4,837,185 A | * | 6/1989 | Yau et al. .................. 438/786 |
| 5,565,036 A | * | 10/1996 | Westendorp et al. ..... 118/723 MP |
| 6,281,132 B1 | | 8/2001 | Nguyen et al. |
| 6,545,370 B1 | * | 4/2003 | Ngo et al. .................... 257/384 |
| 6,713,407 B1 | * | 3/2004 | Cheng et al. ................ 438/775 |
| 2004/0075151 A1 | | 4/2004 | Fung et al. |
| 2005/0170104 A1 | * | 8/2005 | Jung et al. ................... 427/569 |

* cited by examiner

*Primary Examiner*—Zandra V. Smith
*Assistant Examiner*—Khanh Duong
(74) *Attorney, Agent, or Firm*—Kerry B. Goodwin

(57) ABSTRACT

A silicon nitride spacer material for use in forming a PFET device and a method for making the spacer includes the use of a dual-frequency plasma enhanced CVD process wherein the temperature is in the range depositing a silicon nitride layer by means of a low-temperature dual-frequency plasma enhanced CVD process, at a temperature in the range 400° C. to 550° C. The process pressure is in the range 2 Torr to 5 Torr. The low frequency power is in the range 0 W to 50 W, and the high frequency power is in the range 90 W to 110 W. The precursor gases of silane, ammonia and nitrogen flow at flow rates in the ratio 240:3200:4000 sccm. The use of the silicon nitride spacer of the invention to form a PFET device having a dual spacer results in a 10%–15% performance improvement compared to a similar PFET device having a silicon nitride spacer formed by a RTCVD process.

5 Claims, 9 Drawing Sheets

METHOD OF FORMING SIDEWALL SPACER USING DUAL-FREQUENCY PLASMA ENHANCED CVD

BACKGROUND OF INVENTION

The present invention relates in general to the manufacture of integrated circuits, and in particular relates to spacer films used in semiconductor devices.

Semiconductor devices such as a metal oxide semiconductor field effect transistors (MOSFETs) are known in the art. P-type FETs (PFETs) or n-type FETs (NFETs) are often formed using very different dopant species. These species have very different physical properties such as diffusion rate and maximum activated concentration. A spacer is used to define the edge for the source-drain implants for a FET device. When a voltage is applied at the gate and the channel under the gate oxide is active, there is flow of electrical carriers from the source to the drain.

The use of dual spacers has been described, for example by Fung et al. (co-assigned U.S. patent application Ser. No. 10/277,907, filed on Oct. 21, 2002, to the same assignee as the present application), which is incorporated by reference herein in its entirety, to optimize the performance of different MOS devices, e.g. NFET or PFET device performance, independently on the same substrate. In the example of dual spacers, where the spacer width next to poly gate conductor on the PFET device is different from the spacer width next to the poly gate conductor on the NFET device. This kind of spacer can also be called an asymmetric spacer. In this device construction, the spacer width on the PFET is greater than the width on the NFET by almost a factor or 2, i.e., for an NFET spacer width of 40 nm, the corresponding PFET spacer is about 80 nm in width. The PFET spacer is larger since it usually is in relation to the implant species that is used in the source-drain region that typically contains boron. When the implant species are activated through the source-drain activation anneal, the large spacer on the PFET helps in defining the appropriate edge for the implant profile for the source-drain regions. The thinner spacer width on the NFET is designed to maximize the device performance.

A variety of different silicon nitride films can be used to define the spacer, which is part of the first processing step towards forming a spacer. Conventionally, a high temperature furnace silicon nitride could be deposited, or if the thermal budget from a furnace operation is deemed excessive, a rapid thermal processed silicon nitride film is deposited using a chemical vapor deposition (RTCVD) method. The typical temperature for an RTCVD film is about 700° C. to 800° C., for a process deposition time less than 5 minutes per wafer, more typically between about 2 to 3 minutes. However, the temperatures used in RTCVD processing may still exceed the thermal budget for the device. Other methods to deposit silicon nitride films at lower process temperatures of 400° to 500° C. are known using plasma enhanced CVD techniques (PECVD), where the plasma plays a critical role in achieving the formation and deposition of silicon nitride films on the substrate. However, the conventional technique of using a PECVD film suffers from a serious conformality problem, that is, the film is uniform when deposited on near-planar substrate features but has uneven thickness when features with different aspect ratio are present.

For example, by the time the spacers are to be formed to make a semiconductor device, the gate poly conductor is typically patterned. The width of the poly conductor lines would be typically between 300 Å to 800 ÅA, and height of the poly conductor line is typically in the order of 1000 Å to 2000 Å. Referring to FIG. 1, a substrate 10 is illustrated, having polysilicon lines 20. The deposition thickness of the silicon nitride layer 30 would vary along different regions. The poly conductor (PC) line 20 is the feature over which the spacer needs to be deposited and shaped. Region A of the silicon nitride layer 30 denotes the planar region 31 overlying the substrate 10; region B of the nitride layer 30 denotes the portion overlying the top surface 21 of the PC line; C denotes the region of the nitride layer 30 covering the vertical side well 22 of the PC line; region D denotes the transition region of the nitride layer from to vertical sidewall region C to the planar horizontal region A of the nitride layer 30. Typically for a PECVD silicon nitride tUna, the thickness on vertical sidewall C is about 30 to 80% of the thickness of the planar region A, depending on the aspect ratio. For forming a spacer and using it to define as a device, the transitional region D is of great importance. The transition region D of the nitride layer 30 should be continuous and without seams. The thickness and uniformity of transition region D would vaxy based on the aspect ratio of the PC line 20. The two big problems for PECVD silicon nitxide filnis for spacer applications is the poor confonnality (less than 50% ) and the presence of seams 43 (which may be observed from subsequent wet cleans that are used to form cobalt silicide junction Contacts to the source-drain regions).

There is, therefore, a need for a method of forming nitride spacers that have improved conformality and uniformity (i.e., absence of seams).

SUMMARY OF INVENTION

In view of the foregoing, it is an objective of the present invention to provide a low-temperature method for forming a silicon nitride layer that has good conformality.

In a first aspect, the present invention provides a method of depositing a silicon nitride layer over a substrate having a gate stack, by means of a dual-frequency plasma enhanced CVD process, the CVD process comprising a temperature in the range 400° C. to 550° C., preferably about 480° C., and forming a spacer on the gate stack from the silicon nitride layer, and forming a PFET device from the gate stack. The pressure is in the range 2 Torr to 5 Torr, preferably about 2.5 Torr. The low frequency power is in the range 0 W to 50 W, preferably about 40 W. The high frequency power is in the range 90 W to 110 W, preferably about 100 W. The precursor gases of silane, ammonia and nitrogen preferably flow at flow rates in the ratio 240:3200:4000 sccm. The resulting silicon nitride film has the properties: Rutherford Back Scattering (RBS) ratios of Si, N, H of 0.4:0.48:0.12; Fourier Transform Infrared absorption (FTIR) ratio of Si—H/N—H of 0.10 (1.6E21/1.54E22); the percent bonded hydrogen (% at-H) is less than 10% by volume; and a refractive index of 1.95±0.05. The as deposited stress of the film was 3 Giga-dynes/cm$^2$, compressive in nature.

In another aspect of the invention, a silicon nitride film is provided with a vertical to horizontal coverage ratio between 70% to 90%.

In yet another aspect of the invention, a silicon nitride film is provided having a stress in the range from +8 Giga-dynes/cm$^2$ tensile to −7 Gigadynes/cm$^2$ compressive.

In another aspect of the invention, a PFET device is formed having a spacer using a silicon nitride film formed using a low-temperature dual-frequency plasma enhanced CVD process. The spacer is preferably a dual spacer.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF DRAWINGS

For a more complete understanding of the present invention, and the advantages thereof, reference is now made to the following descriptions taken in conjunction with the accompanying drawings, which are not necessarily drawn to scale.

DETAILED DESCRIPTION

Figure 1:
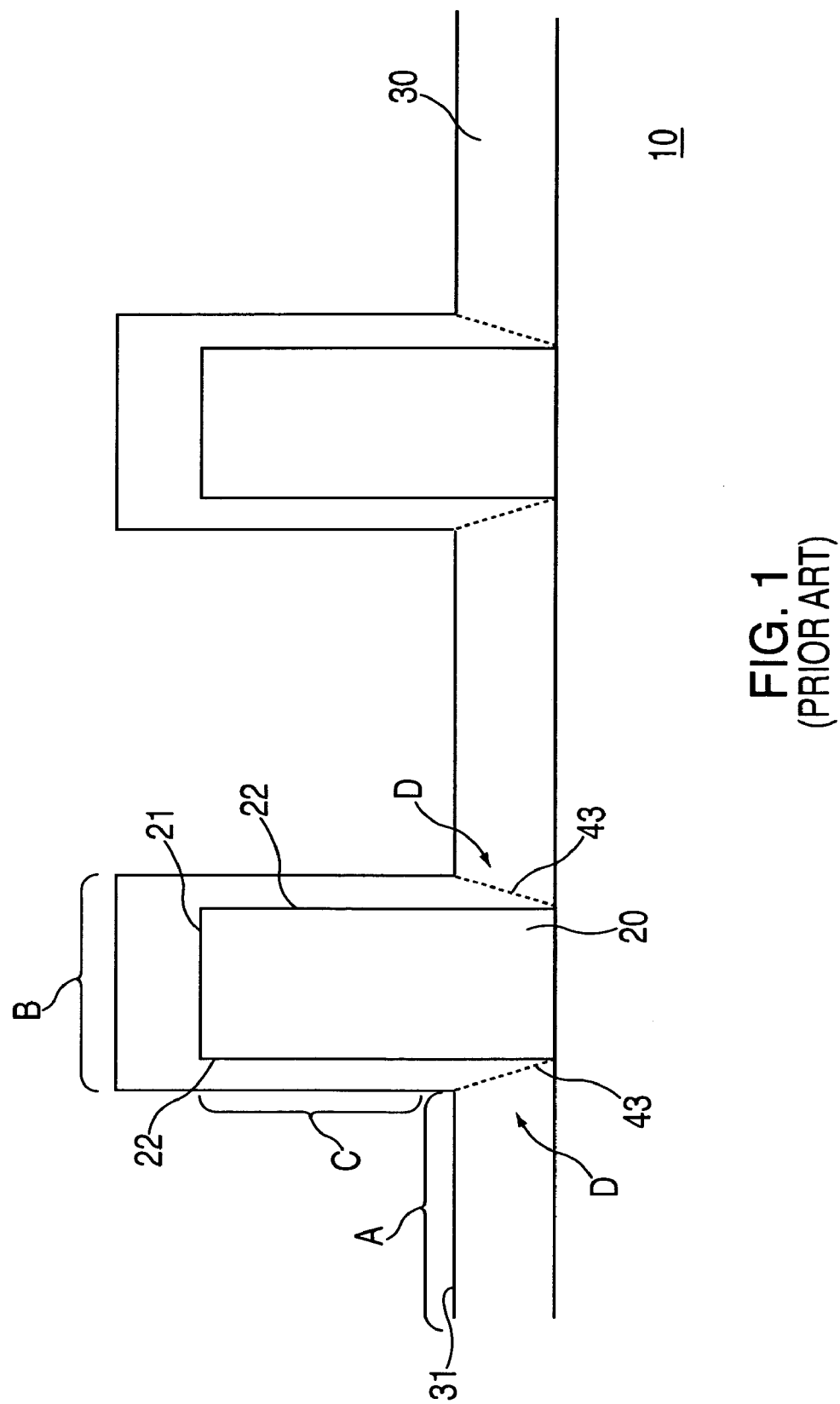
FIG. 1 illustrates a prior art structure having a silicon nitride layer deposited by a prior art PECVD process.

In the following description, numerous specific details may be set forth to provide a thorough understanding of the present invention. However, it will be obvious to those skilled in the art that the present invention may be practiced without such specific details.

Refer now to the drawings wherein depicted elements are not necessarily shown to scale and wherein like or similar elements are designated by the same reference numeral through the several views.

Figure 2:
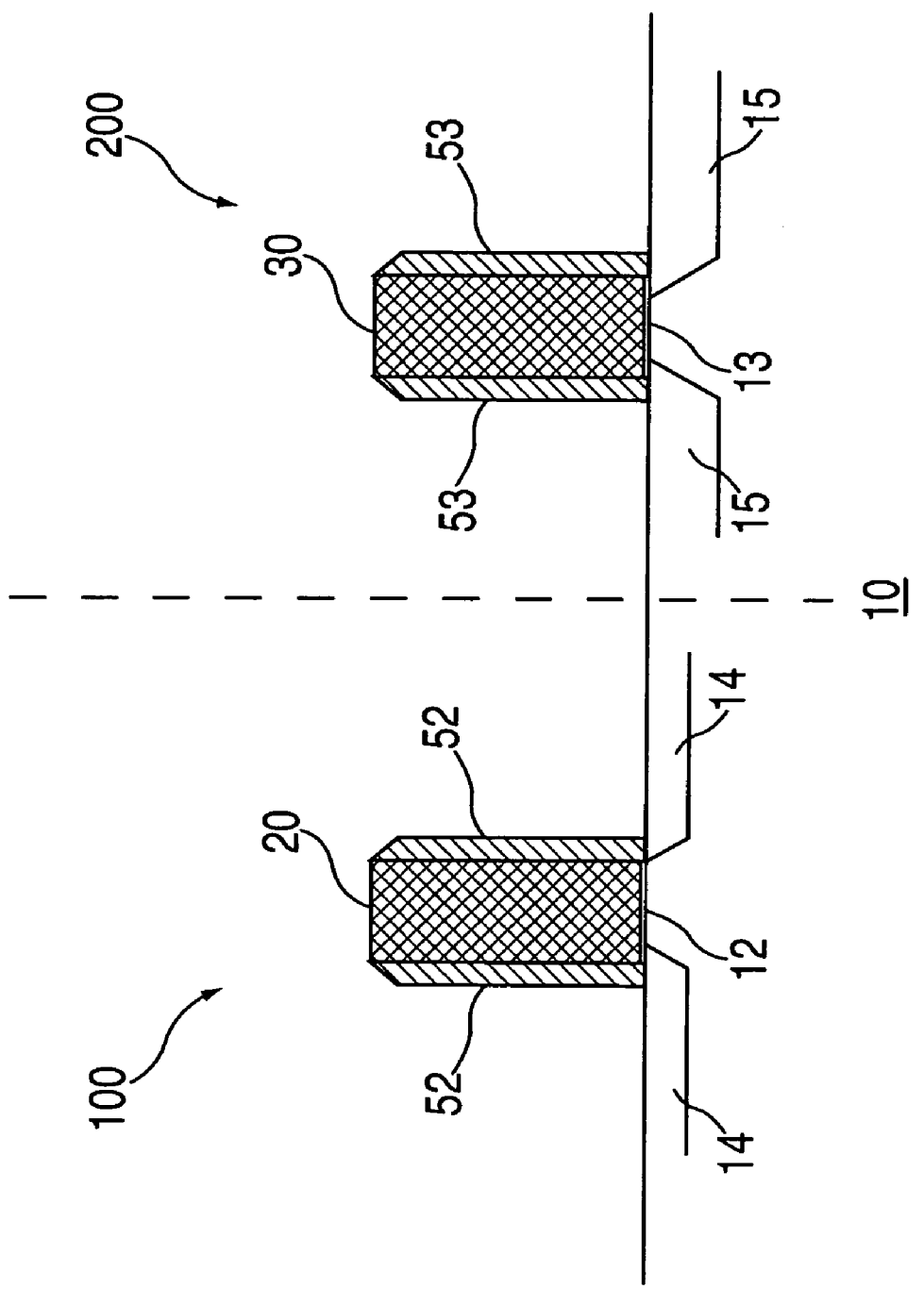
FIG. 2 illustrates a substrate include a gate stack.

FIG. 2 shows two gate stacks 20, 30 formed by techniques known in the art on the same semiconductor substrate 10 in an NFET region 100 and a PFET region 200 respectively. The gate stacks may be comprised of a polysilicon conductor, having width typically between about 300 Å to 800 Å, and the height of the poly line is typically on the order of 1000 Å to 2000 Å. The substrate may be a bulk wafer, SOI wafer, GaAs or any type of semiconductor substrate. A gate oxide layer 12, 13 may be present under the gate stacks 20, 30, respectively. Dielectric spacers 52, 53 formed on the sidewalls of the gate stacks are schematically shown as single spacers for discussion, but are understood alternatively to include multiple layers (composite spacers). Implant regions 14, 15 may also be formed by methods known in the art, which will typically form the source/drain regions, and may include both halo and extension implants, as known in the art. Other features, such as isolation features, may be included but are not shown for clarity of explanation.

Figure 3:
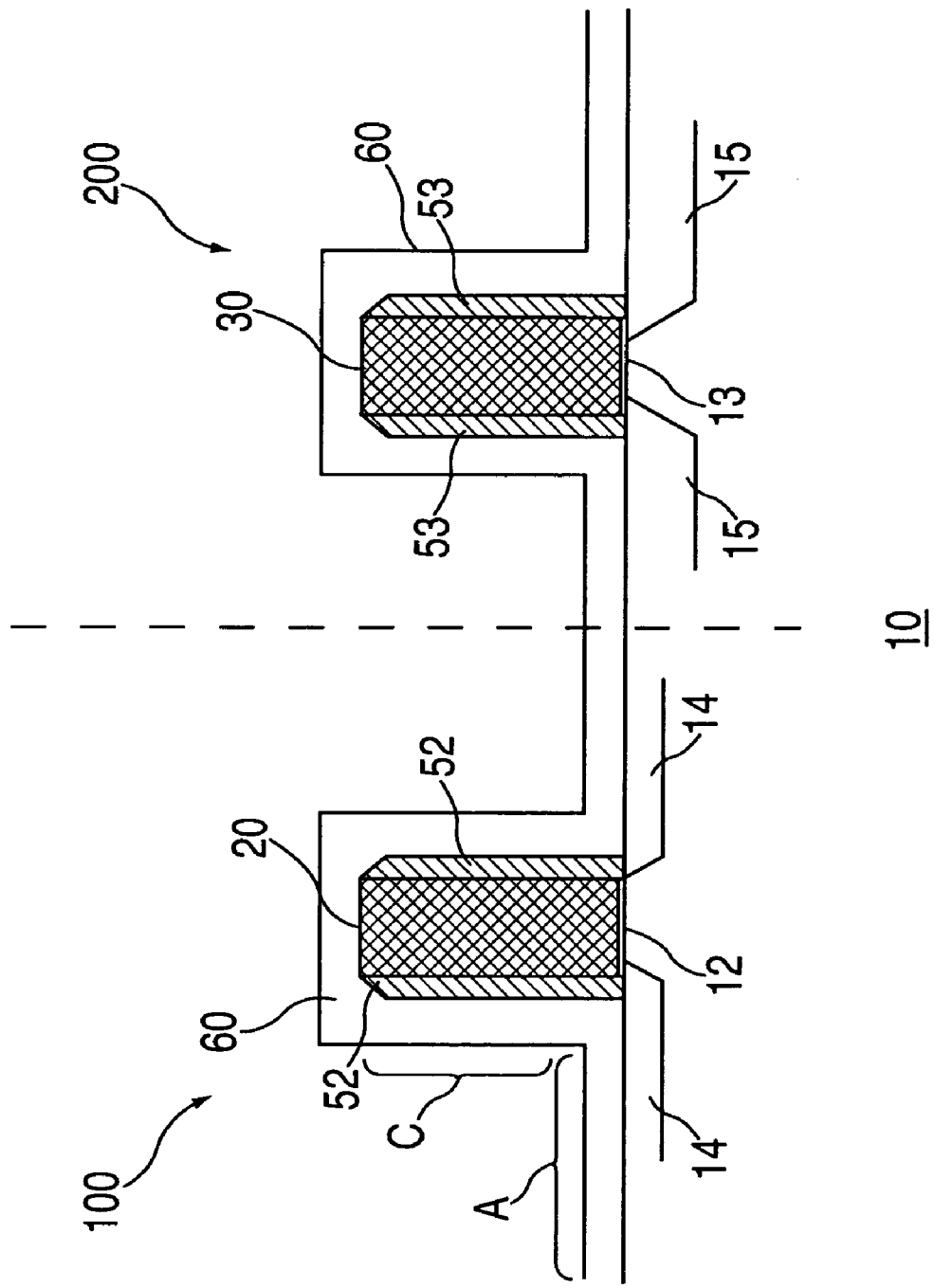
FIG. 3 is a structure having a silicon nitride layer formed in accordance with the invention.

Then, in accordance with the present invention, a thin film dielectric 60 is deposited conformally over the structure including gate stacks 20, 30 and the exposed surface of the substrate 10 as illustrated in FIG. 3. In accordance with the present invention, dielectric is preferably a silicon nitride film deposited using a dual-frequency plasma enhanced CVD process, wherein the deposition temperature is between about 400° C. to 550° C., and at pressures in the range 2 Torr up to 5 Torr. The power of the dual frequency plasma generator is preferably about 100 W±10 W for the high frequency power, and between 0 to 50 W for the low frequency power. For example, using a dual-frequency plasma tool from Applied Materials, Inc., a deposition temperature of 480° C., 2.5 Torr, high frequency power of 100 W and low frequency power of 40 W may be used according to the invention. The flow rates of precursor gases of silane, ammonia and nitrogen were in the ratio about 240:3200:4000 sccm using this tool configuration. The conformality of the resulting silicon nitride layer 60 has a coverage ratio (thickness at sidewall region C compared to horizontal region A over the substrate surface) is between 70% and 90%, more typically about 80%.

Figure 4:
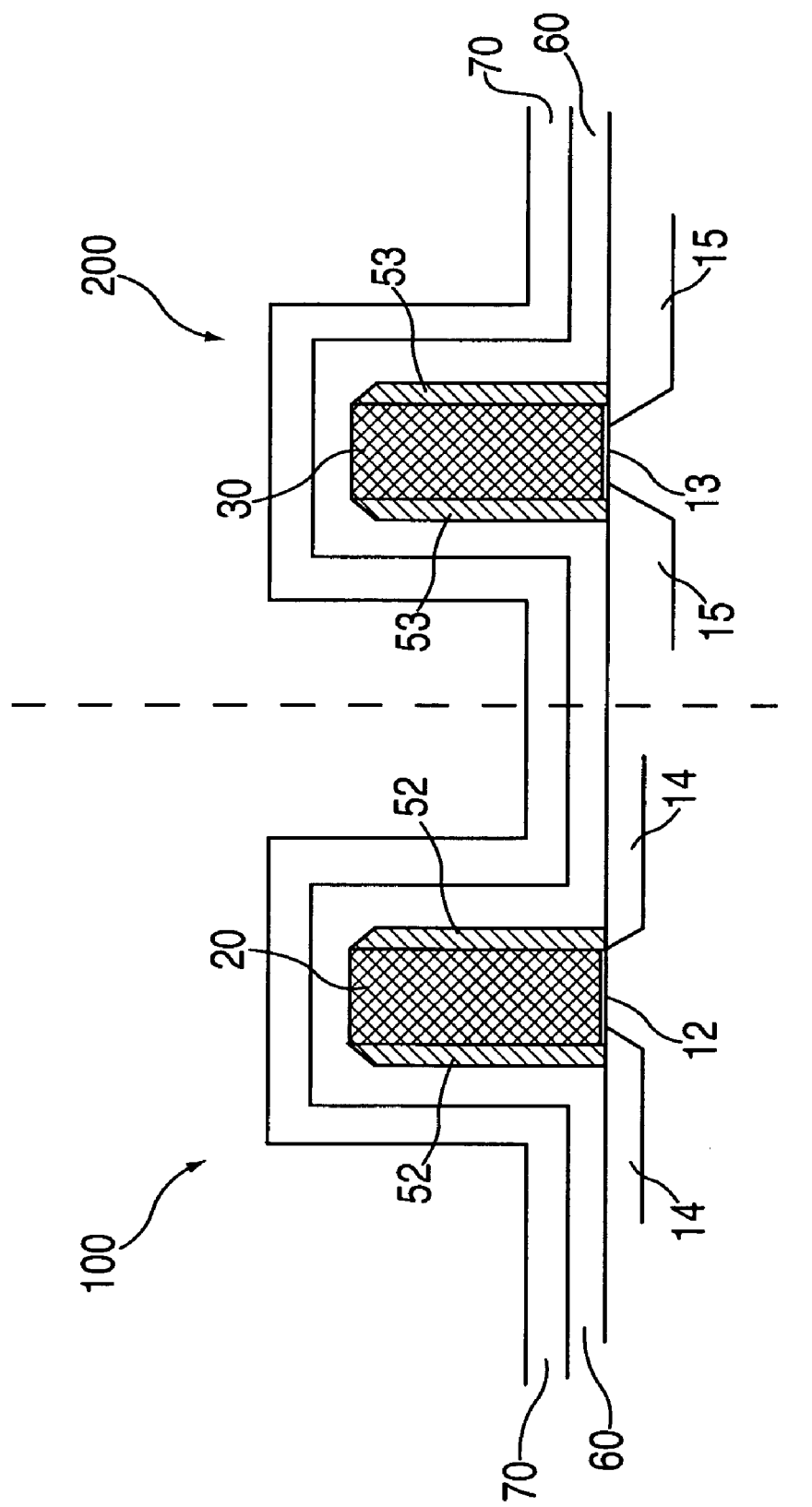
FIG. 4 illustrates a structure during the formation of a PFET device in accordance with the invention.
Figure 5:
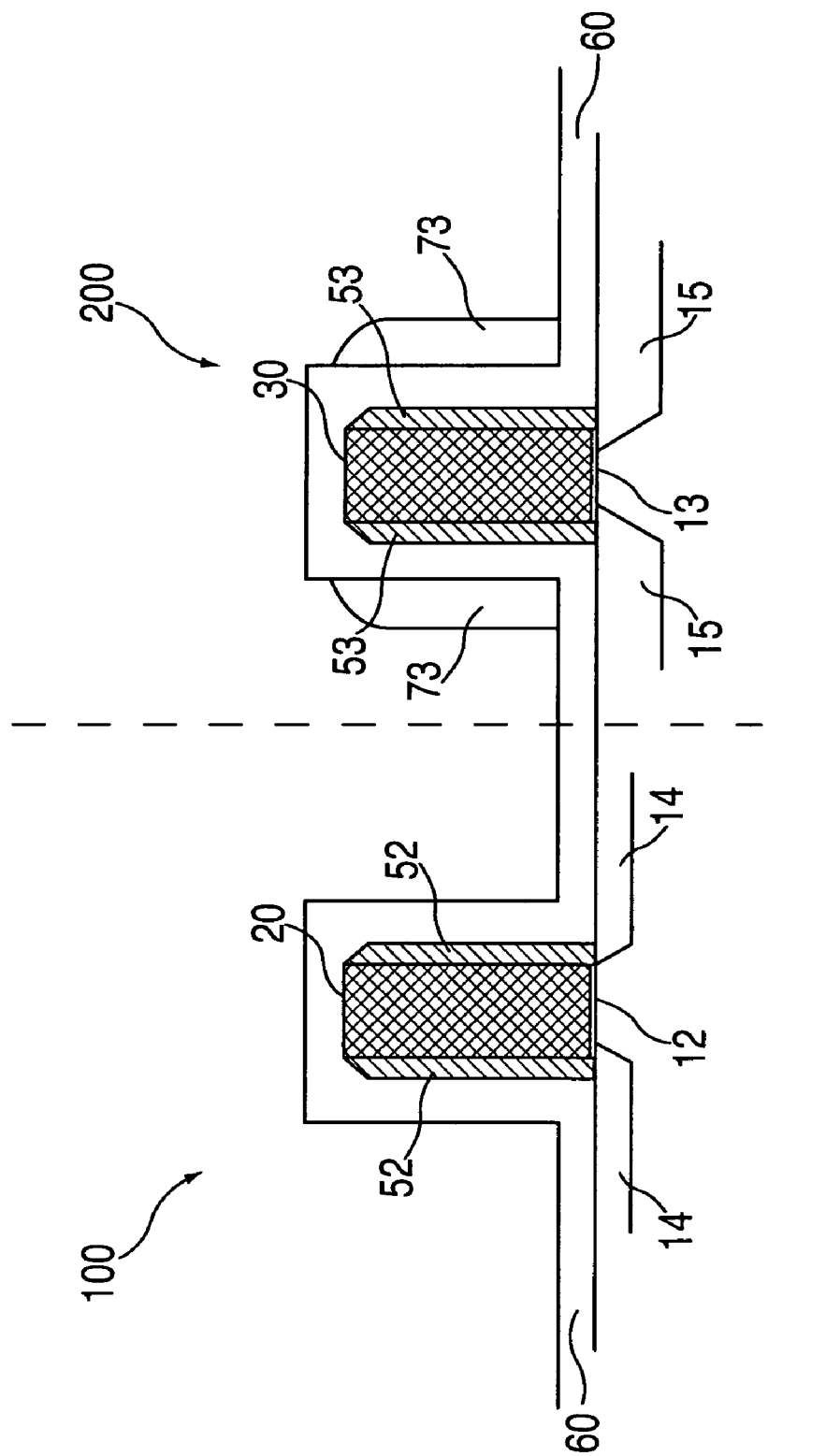
FIG. 5 illustrates a structure during the formation of a PFET device in accordance with the invention.

Then, a second film dielectric 70 (e.g. CVD oxide) is also deposited, resulting in the structure illustrated in FIG. 4. Subsequently, the second dielectric film 70 is processed to form spacers 73 on the sidewalls overlying the conformal silicon nitride film 60 along the sidewalls of the gate stack 30 in the PFET region 200. The spacers 70 may be formed by any process known in the art, including for example, using a photoresist as a mask to protect the PFET region 200, and performing a wet etch (such as a buffered hydrofluoric acid mixture) or dry etch to remove the dielectric film 70 from the NFET region selective to the silicon nitride film, followed by an anisotropic etch of the PFET region to form the spacers 73. Alternatively, a directional etch may be applied to form spacers on both NFET and PFET gate structures 20, 30, followed by a mask to protect the PFET region 200, and a selective etch to remove the dielectric spacers from the NFET region 100, leaving spacers 73 in the PFET region. The resulting structure is illustrated in FIG. 5.

Figure 6:
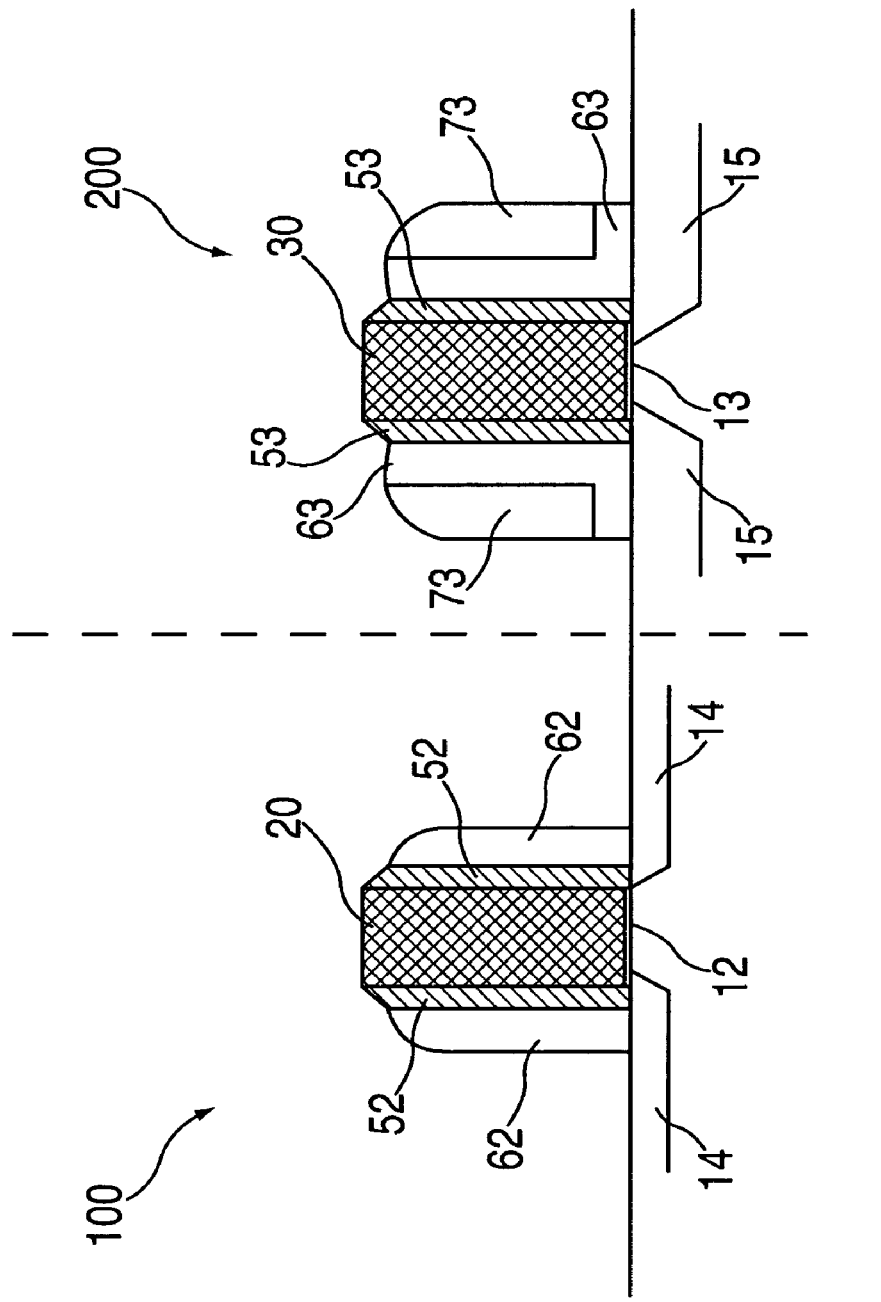
FIG. 6 illustrates a structure during the formation of a PFET device in accordance with the invention.

An anisotropic or directional etch (i.e. such as RIE) of the silicon nitride layer 60 is performed, resulting in narrow spacers 62 on the NFET region 100 and composite L-shape spacers 63 on the PFET region 200, as illustrated in FIG. 6. During this step, the oxide spacer 73 that was formed previously acts as a masking structure and helps to define the L-shaped nitride spacers 63 for the PFET.

Figure 7:
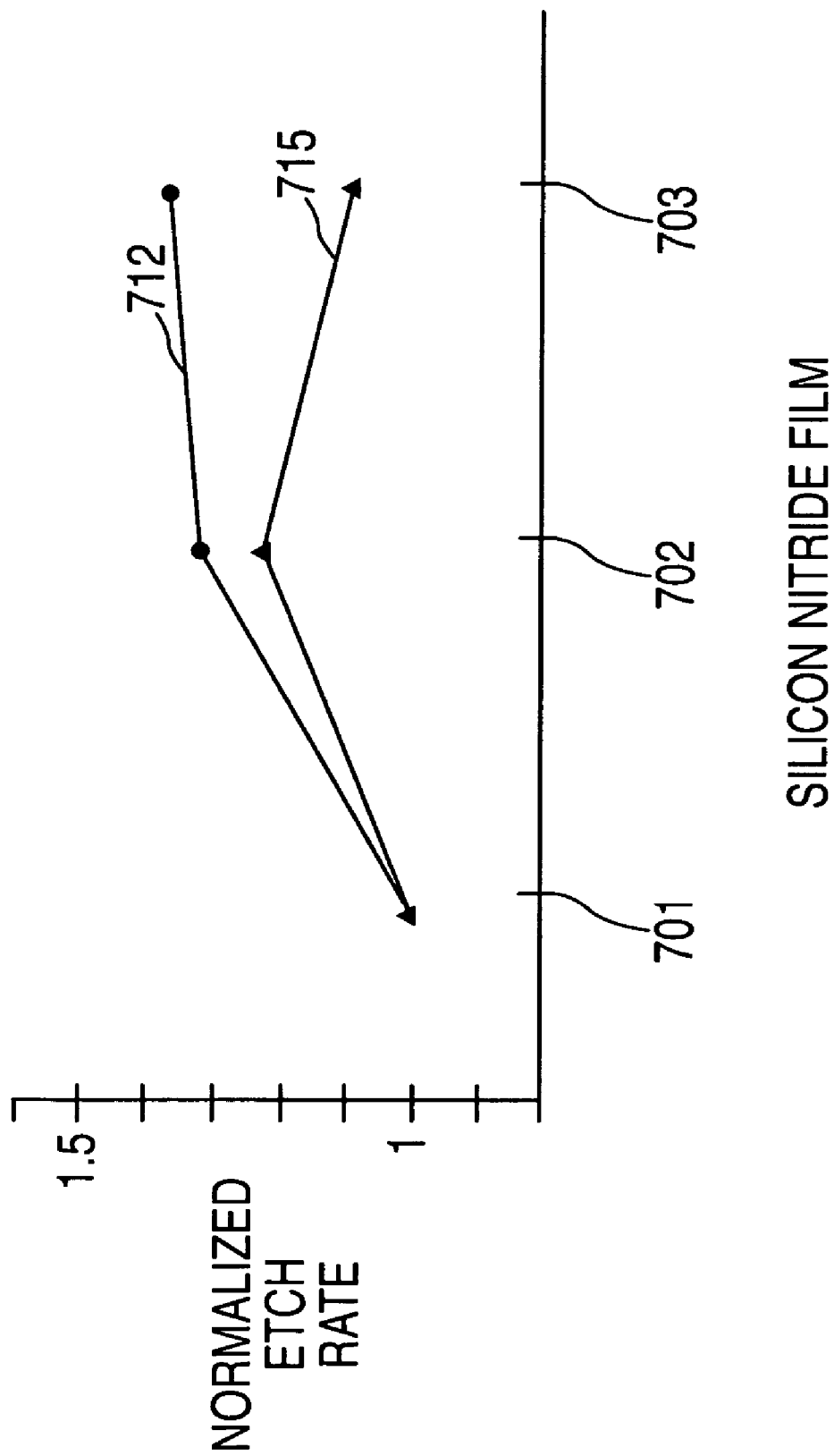
FIG. 7 illustrates plots of normalized etch rate for the inventive silicon nitride film compared to prior art silicon nitride films.

The directional etch used to form the spacers 62, 63 from the nitride layer 60 deposited in accordance with the present invention must be adjusted in comparison to a directional etch used for nitride layers formed by conventional means. The etch rate of prior art nitride films compared to the etch rate of the nitride film deposited by the method of the present invention is compared in FIG. 7. The etch rates plotted in FIG. 7 are normalized to the etch rate of a prior art nitride layer 701 deposited by RTCVD at a temperature of about 725° C. Also plotted is the etch rate of the nitride layer deposited in accordance with the present invention (702) and the etch rate of a prior art PECVD method (703). The curve 715 indicates the etch rates using a spacer RIE process. It can be seen that the RIE spacer etch rate for dual-frequency plasma enhanced CVD silicon nitride film 702 of the present invention is higher than the RIE etch rates for RTCVD spacer material 701 or for PECVD spacer material 703. Thus, the RIE process must be adjusted to prevent overetching, as known in the art.

Figure 8:
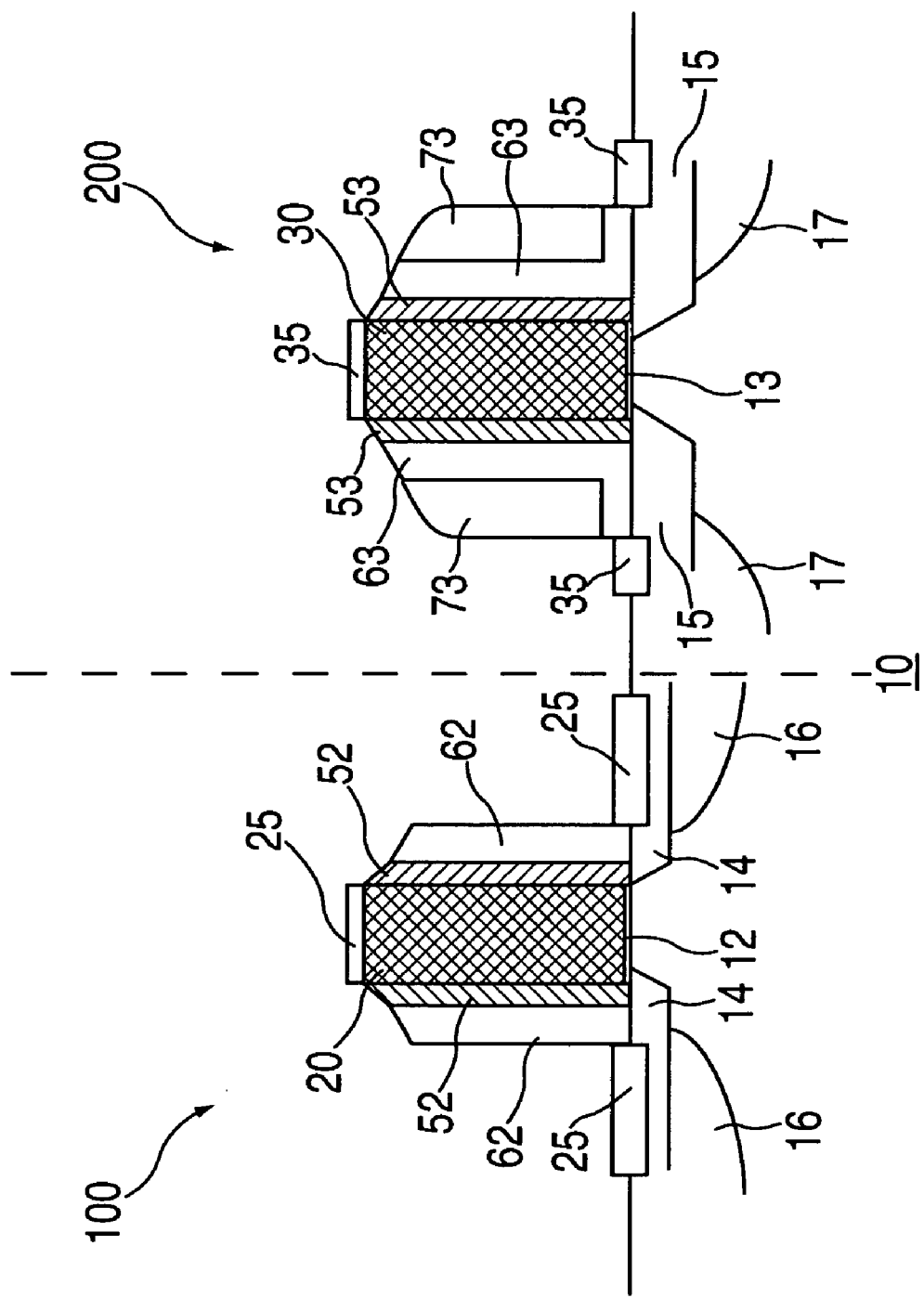
FIG. 8 illustrates a structure during the formation of a PFET device in accordance with the invention.

Subsequent processing proceeds by methods known in the art. After the nitride spacers 62, 63 are formed, the source-drain implants 16, 17 are formed. This is followed by an activation anneal at high temperature for a very short time, typically a 1000° C. to 1100° C. process temperature for a time that is less than 5 seconds. This high temperature step is used to define the implant profiles in the substrate for the various devices. Subsequent processing involves the making of salicide contacts 25, 35, such as cobalt silicide, that is used to make contact with the wiring levels, resulting in the structure illustrated in FIG. 8.

The spacer material that is used has to be compatible with a variety of wet cleans that are used, such as a mixture of buffered hydrofluoric acid and another mixture of HF and ethylene glycol. Typically, silicon nitride films do not etch substantially in a mixture of buffered hydrofluoric acid, but do etch in a mixture of HF and ethylene glycol. Curve 712 of FIG. 7 indicates the normalized etch rate of a wet clean using a mixture of hydrofluoric acid (HF) and ethylene glycol (EG) at 80° C. Note that the etch rates of the dual-frequency plasma enhanced nitride of this invention (702) and of a conventional PECVD nitride (703) are higher than an RTCVD nitride (701). If there were any seams/weak points in the silicon nitride film in the transition region, then during these wet etches to form the salicide, the wet etching chemistries can access the gate oxide and cause device reliability issues. Therefore from a process integration standpoint, it is important for the silicon nitride material that is used for the spacer to be compatible with RIE processing and with wet etch chemistries to obtain the desired thickness and minimize formation of seams or other defects. The conformal nitride layer 60 deposited in accordance with the present invention minimizes the formation of seams, compared to a nonconformal nitride layer 30 (see FIG. 1) formed using a convention PECVD process.

The silicon nitride film 60 deposited in accordance with the present invention, use lower processing temperatures for plasma enhanced CVD deposition, which are advantageous from a device standpoint. A variety of species, such as arsenic and boron are used to implant into the substrate to define the device formation. Typically the well implant for the device regions are done prior to forming the PC, and the halo and extension implants to define the device are done after forming the PC. One of the dopant species that is most sensitive to temperature is boron, where the diffusion of boron is increases with higher temperature. During the spacer deposition process using a silicon nitride material, the deposition temperature directly correlates to the boron diffusion in the substrate. The use of lower temperature plasma enhanced CVD silicon nitride films would be therefore most advantageous for limiting the extent of boron diffusion compared to higher temperature furnace deposition or RTCVD processes.

In other aspect of this invention, the dual spacer may be used in conjunction with an offset spacer. An offset spacer is formed on the PC lines with either a silicon dioxide or a silicon nitride material. The use of an offset spacer is also well known in the art. The halo and the extension implants for the devices are now away from the edge of the PC by the thickness of the offset spacer. This improves the roll-off characteristics of the PFET device without deteriorating the NFET device.

In a preferred embodiment of the process, using the dual-frequency tool from Applied Materials, Inc., with a low frequency power setting of 40 W and a high frequency power setting of 100 W, at a temperature of 480° C., 2.5 Torr, and flow rates of silane, ammonia and nitrogren at 240:3200:4000 sccm, the silicon nitride film 60 was observed to have the following properties: Si, N, H ratios of 0.4:0.48:0.12 based on Rutherford Back Scattering (RBS); Fourier Transform Infrared absorption (FTIR) ratio of Si—H/N—H of 0.10 (1.6E21/1.54E22); percent bonded hydrogen (% at-H) less than 10% by volume; and a refractive index of 1.95±0.05. The as deposited stress of the film was 3 Gigadynes/$cm^2$, compressive in nature, with a stress range from +8 Gigadynes/$cm^2$ tensile to −7 Gigadynes/$cm^2$ compressive.

Figure 9:
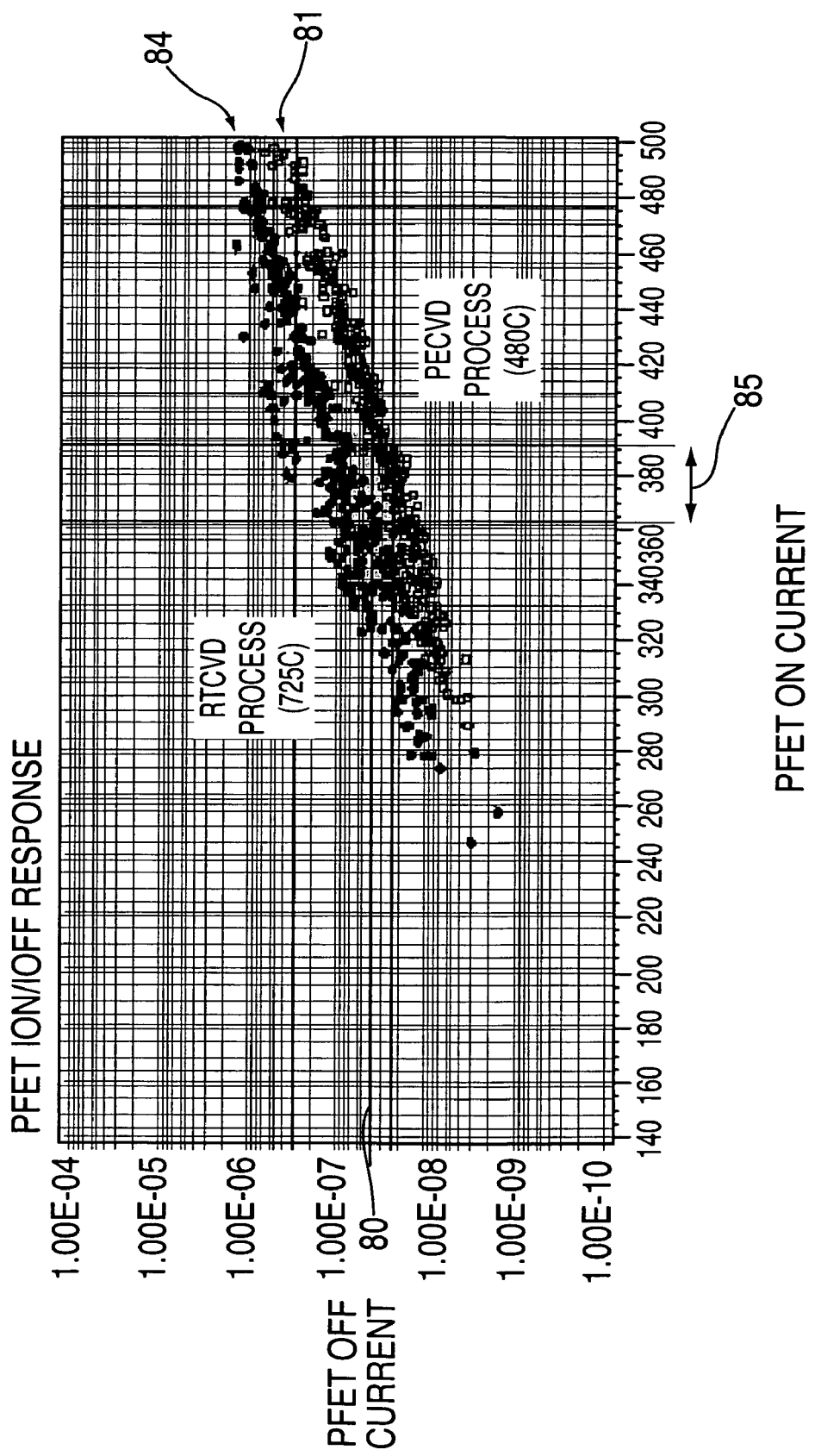
FIG. 9 illustrates plots of off current versus on current for PFET devices having spacers formed in accordance with the invention, compared to PFET devices having spacers formed using a prior art RTCVD process.

The silicon nitride spacer 62, 63 formed in accordance with the invention was implemented and a 10% to 15% improvement in the PFET drive current was observed compared to a PFET using spacers formed by an RTCVD process, as illustrated in FIG. 9. For a given off-current, for example, an off current of about 40 nAmps/micron is indicated by reference numeral 80, it is preferable to have a higher on current. Merely by using the spacers 62, 63 formed in accordance with the invention, a significant 10% to 15% improvement (85) in the ratio of on current to off current was unexpectedly observed for the off current of the PFET spacers formed according to the invention (81) compared to the PFET performance using spacers formed by an RTCVD process.

Although the present invention and its advantages have been described in detail, it should be understood that various changes, substitutions and alterations can be made herein without departing from the spirit and scope of the invention as defined by the appended claims.

The invention claimed is:

1. A method of forming a PFET device comprising the steps:
   providing a substrate having at least one gate stack having first and second sidewalls;
   depositing a silicon nitride layer by means of a dual-frequency plasma enhanced CVD process, the CVD process comprising a temperature of 480° C., a low frequency power of 40 W, and a high frequency power of 100 W;
   forming a spacer on said at least one gate stack from said silicon nitride layer; and
   forming a PFET device comprising said at least one gate stack having said spacer.

2. The method of claim 1 wherein said dual-frequency plasma enhanced CVD process further comprises a pressure in the range 2 Torr to 5 Torr.

3. The method of claim 1 wherein said dual-frequency plasma enhanced CVD process further comprises precursor gases of silane, ammonia and nitrogen at flow rates in the ratio 240:3200:4000 sccm.

4. The method of claim 1 wherein said dual-frequency plasma enhanced CVD process further comprises a pressure of 2.5 Torr.

5. A method of forming a PFET device comprising the steps:
   providing a substrate having at least one gate stack having first and second sidewalls;
   depositing a silicon nitride layer by means of a dual-frequency plasma enhanced CVD process, the CVD process comprising a temperature of 480° C., a pressure in the range 2 Torr to 5 Torr, a low frequency power of 40 W, a high frequency power of 100 W, and precursor gases of silane, ammonia and nitrogen at flow rates in the ratio about 240:3200:4000 sccm, wherein the silicon nitride layer has a vertical to horizontal coverage ratio between 70 to 90 percent;
   forming a spacer on said at least one gate stack from said silicon nitride layer; and
   forming a PFET device comprising said at least one gate stack having said spacer.

* * * * *